United States Patent
Baker et al.

(10) Patent No.: US 10,326,452 B2
(45) Date of Patent: Jun. 18, 2019

(54) SYNCHRONIZING A SELF-TIMED PROCESSOR WITH AN EXTERNAL EVENT

(71) Applicant: Eta Compute, Inc., Westlake Village, CA (US)

(72) Inventors: David Baker, Austin, TX (US); Paul Murtagh, Westlake Village, CA (US)

(73) Assignee: Eta Compute, Inc., Westlake Village, CA (US)

( * ) Notice: Subject to any disclaimer, the term of this patent is extended or adjusted under 35 U.S.C. 154(b) by 0 days.

(21) Appl. No.: 16/132,187

(22) Filed: Sep. 14, 2018

(65) Prior Publication Data

US 2019/0097634 A1    Mar. 28, 2019

Related U.S. Application Data

(60) Provisional application No. 62/562,392, filed on Sep. 23, 2017.

(51) Int. Cl.
| | |
|---|---|
| *G06F 17/50* | (2006.01) |
| *H03K 19/00* | (2006.01) |
| *H03K 19/20* | (2006.01) |
| *H03K 19/096* | (2006.01) |

(52) U.S. Cl.
CPC ..... *H03K 19/0966* (2013.01); *H03K 19/0016* (2013.01); *H03K 19/20* (2013.01); *G06F 17/5059* (2013.01)

(58) Field of Classification Search
CPC ........... H03K 19/0966; H03K 19/0016; H03K 19/20; G06F 17/5059
USPC .......................................................... 326/93
See application file for complete search history.

(56) References Cited

U.S. PATENT DOCUMENTS

| | | | | |
|---|---|---|---|---|
| 7,746,106 | B1 * | 6/2010 | Gaide | H03K 19/1736 326/38 |
| 7,861,130 | B2 * | 12/2010 | Sotiriou | G01R 31/3016 714/731 |
| 8,928,386 | B1 * | 1/2015 | Ganusov | G06F 13/4009 327/293 |
| 9,584,305 | B2 * | 2/2017 | Yang | |
| 2005/0156632 | A1 * | 7/2005 | Sandbote | G06F 9/3869 326/93 |
| 2015/0074446 | A1 * | 3/2015 | Tong | G06F 9/3851 713/502 |
| 2017/0371993 | A1 * | 12/2017 | Sarrazin | G06F 17/5068 |
| 2018/0024837 | A1 * | 1/2018 | Sadowski | G06F 9/30145 712/226 |

* cited by examiner

*Primary Examiner* — Don P Le
(74) *Attorney, Agent, or Firm* — SoCal IP Law Group LLP; Angelo Gaz; Steven Sereboff

(57) ABSTRACT

There is disclosed a self-timed processor. The self-timed processor includes trigger logic having a trigger input to receive an event trigger signal, a data input set to data value 1, a trigger output to send a trigger output signal when the event trigger signal is received, and a reset input to reset the trigger output signal. The processor also has a delay insensitive asynchronous logic (DIAL) block with multi-rail DIAL inputs to receive a multi-rail DIAL input having a) the trigger output signal, and b) data value 0; and data phase completion logic to output a completion signal indicating an end of a data propagate phase of the DIAL block to reset the trigger output signal when multi-rail data DIAL data process values of the DIAL block reach a DIAL valid state.

21 Claims, 4 Drawing Sheets

SYNCHRONIZING A SELF-TIMED PROCESSOR WITH AN EXTERNAL EVENT

RELATED APPLICATION INFORMATION

This patent claims priority from provisional patent application 62/562,392, filed Sep. 23, 2017, titled METHOD AND CIRCUIT FOR CONVEYING AN EXTERNAL EVENT TO A SELF-TIMED PROCESSOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to self-timed or asynchronous digital logic circuits.

Description of the Related Art

In this patent, the term "processor" means a digital circuit that acts upon data to perform some function. A processor as referred to herein may be as simple as a single block of combinatorial logic or may be a microprocessor, a microcontroller, a digital signal processor, a graphic processor, a coprocessor, a network processor, or some other type of processor. A processor may typically, but not necessarily, execute multiple sequential steps to accomplish its assigned function. For example, a processor may execute a sequence of stored instructions. Processors that may not execute stored instructions include single-purpose processors such as encryption engines and fast Fourier transform engines. The sequence of operations performed by such engines may be controlled, for example, by a hardware state machine rather than stored instructions.

Most digital processors in use today are synchronous, which is to say various elements within the digital processor operate synchronously in response to a common clock signal. The power consumption of a synchronous processor depends on the complexity of the processor (i.e. the number of gates and other functional elements), the clock rate, and the operating voltage. In general, higher operating speed requires higher operating voltage. To minimize the power consumption of a synchronous digital logic circuit, the circuit may be operated at the lowest possible clock rate consistent with the circuit function and the lowest voltage that will support operation at that clock rate. The methodology and tools for designing synchronous logic circuits are well developed, so long as the processor circuit is designed to operate from a power supply voltage substantially above the threshold voltage of the transistors comprising the processor. However, to achieve the lowest possible power consumption, it may be preferable to operate a digital logic circuit at a voltage near or below the transistor threshold voltage. While research papers have shown that near-threshold operation of synchronous processors (i.e., operation with a power supply voltage near the transistor threshold voltage) may be possible, the delay of near-threshold and below-threshold logic gates may vary by a factor of up to 100 over an operating temperature range, and may vary by a factor of five or more between gates at a single temperature. As a consequence, it is difficult, if not impossible, to estimate the minimum required clock frequency for near-threshold voltage operation of synchronous logic circuits.

Asynchronous, or self-timed, processor circuits do not operate from a common clock signal, such that the delay of a self-timed processor is determined solely by the cumulative delay of the gates and other logic elements within the self-timed processor. Self-timed processors are typically operated in a cyclic manner. A cycle is initiated when input data is provided to the processor. The processor then performs some operation upon the input data, with the time required to perform the operation determined by the accumulated delays of the logic circuits within the processor. When the operation is complete and all of the outputs of the processor have assumed their final values, a feedback or acknowledge signal may be generated to indicate completion of the current cycle and readiness to begin the next cycle.

Delay insensitive asynchronous logic (DIAL) is a delay-insensitive logic paradigm in which each logical value has three defined states: "1", "0", and "null", where the null state indicates that a valid value is not yet available. In contrast, Boolean logic has two defined states: "1" and "0". A DIAL processor or a DIAL "block" is typically operated in a cyclical manner. All of the inputs to a DIAL processor are initially set to the null state, which then propagates through the processor until all of the outputs of the processor assume the null state. This may be referred to as the "propagate null" phase of the processor cycle. The inputs are then set to valid Boolean values, which then propagate through the processor until all of the outputs also assume valid states. This may be referred to as the "propagate data" phase of the processor cycle. When all of the outputs have assumed valid states, the cycle is complete and the acknowledge signal is provided from the output side of the processor to the input side to request initiation of the next cycle. A DIAL "block" may be a collection of DIAL circuits having at least one input and at least one data output, which generates an acknowledge output indicating the state of the DIAL block. A DIAL block may be, or be part of, a self-timed processor.

Dual-rail DIAL uses two signals or rails, each of which has two possible values (1 or 0), to represent each Boolean variable. Typically, on the two rails, a Boolean "1" state is represented by (1,0), a Boolean "0" state is represented by (0,1), the null state is represented by (0,0), and (1,1) is forbidden. In some descriptions, the two rails will be referred to as the "true" and "false" rail. For a Boolean variable "A", the two rails will be designated as t_A, and f_A. A Boolean "1" or "true" state is represented by t_A=1, f_A=0, and a Boolean "0" or "false" state is represented by t_A=0, f_A=1. Either of these may be called "valid" or "valid states". The null state is represented by t_A=f_A=0. The state t_A=f_A=1 is forbidden. Another form of DIAL uses four rails or signals to collectively represent two Boolean variables. The term "multi-rail" may encompass dual-rail and/or four-rail implementations of DIAL. The term "single-rail" may mean a conventional binary or Boolean value with two defined states: "1" and "0".

A subset of DIAL logic is null convention logic (NCL) which may partially or exclusively use threshold gates to perform the NCL logic functions. Threshold gates are a type of logic gate, where "gate" is defined as a logic circuit having two or more inputs combined into a single output. The output of a threshold gate is set to 0 only when all of its inputs are 0. The output of a threshold gate is set to 1 when a predetermined combination of inputs are all 1. With other combinations of inputs, the output of the threshold gate retains its previous value. A nomenclature commonly used to describe some types of threshold gates is "THmn", where "TH" indicates the gate uses "threshold" logic; and n and m are integers. "n" is the number of inputs to the gate, and "m" is the number of inputs that must be 1 for the output of the gate to switch to 1.

Figure 1:
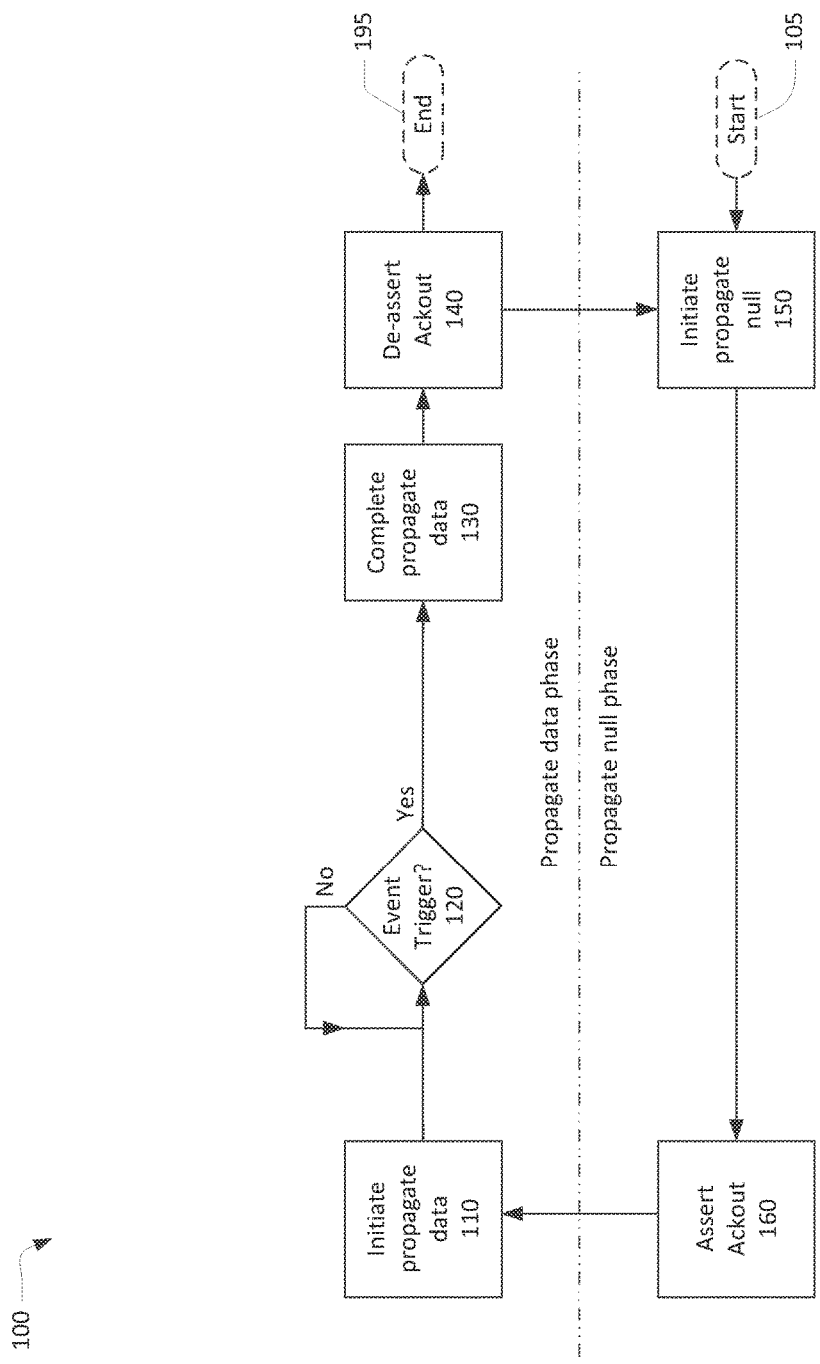
FIG. 1 is a flow chart of a process to convey an external event to a self-timed processor.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

For certain processors, it may be important to "synchronize" a self-timed delay insensitive asynchronous logic (DIAL) block with an event that is external to the DIAL block. For example, a signal may be sent to the DIAL block when a certain external event occurs, and the DIAL block may want to synchronize one or more of its processes with the received signal which indicates that occurrence. The signal indicating the event may be generated, by another completely independent self-timed DIAL block or by a conventionally clocked logic block. The other block may be located on the same integrated circuit as that which the DIAL block is located on, or on another integrated circuit. To perform the synchronization, an asynchronous, or self-timed, processor implementing DIAL may include trigger logic to receive the external event signal and send an output signal indicating the occurrence of the event to the DIAL.

The DIAL block may be all or a portion of an asynchronous processor. It may be free running, such as where its design target is for the block to continuously cycle between the propagate null and propagate data phases. For a free running DIAL block, the synchronizing can be performed by the same event synchronizing processes and/or devices that are used for conventionally clocked logic. For example, provided the DIAL cycle rate of the DIAL block is fast enough (e.g., the time is short enough for cycling between the propagate null and propagate data phases), the event signal may be oversampled. Alternatively, toggle hand shake methods may be used in which one synchronizes the event toggle and then detects the state change to recognize the event.

However, a free running DIAL block will consume unnecessary power while waiting to be synchronized with relatively infrequent events. For instance, the DIAL block may cycle through the propagate null and propagate data phases numerous times before the event arrives. In many applications, it is preferable to run exactly one propagate null/data phase cycle in response to an external event. In other words, it may be desired for the DIAL block to cycle only once through a propagate null and a propagate data phase for each external event that occurs or is signaled to the block. For example, a DIAL block many simply function to increment a counter to count a total number of external events that occur. To increment the counter with synchronous/clocked logic circuits in this case, the event can be used as the clock for the counter. However, this will not work for a self-timed DIAL block because a clock signal is not present in the DIAL block. In this case, a self-timed processor can use a specific type of trigger logic that signals the occurrence of an external event to the DIAL block during a single propagate null/data cycle of the DIAL block.

Description of Process

FIG. 1 is a flow chart of a process 100 for conveying or signaling an external event to a DIAL block. The process 100 may be performed by a small portion of an asynchronous processor. The process 100 may be performed multiple times. The process 100 releases a DIAL block to do exactly one null/data cycle (e.g., the propagate null and propagate data phases occur only once each) in response to the arrival of the event. In other words, during the process 100, a DIAL block of an event trigger circuit may perform exactly one propagate null phase and one propagate data phases only in response to receiving one or each event trigger signal. The process 100 may be initiated at start 105 and terminate at end 195. In some cases, the process 100 will begin at start 105 and cycle between the "Propagate null phase" and the "Propagate data phase" once for each event trigger signal received. However, the cycling may not be continuous and/or periodic due to determining if an event trigger signal has been received at decision block 120 during each propagate data phase.

Specifically, after start 105 a propagate null phase is initiated at 150. Here, all of the multi-rail DIAL input values of the DIAL block may be set to a DIAL null state or value, which then propagates through the DIAL block until all of the outputs of the block assume the null state. This may be referred to as the "Propagate null phase" of the DIAL block or processor cycle. Here an acknowledgment signal may continue to be de-asserted until the propagate null phase is completed at 160.

After initiation at 150, once all of the outputs reach the DIAL null state, an acknowledgment signal is asserted by the DIAL block at 160. Asserting the acknowledgment signal at 160 ends the propagate null phase and causes the propagate data phase of the DIAL block to be initiated at 110. The acknowledgment signal at 160 may continue to be asserted until the propagate data phase is completed at 130.

After 110, during the propagate data phase, the multi-rail DIAL input values of the DIAL block may be set to DIAL valid states, such as to valid Boolean values, which then propagate through the DIAL block until all of the outputs also assume valid states. This may be referred to as the "Propagate data phase" of the DIAL block or processor cycle.

During the propagate data phase, after the multi-rail DIAL input values of the DIAL block are set to DIAL valid states, it is determined whether an event trigger signal has been received at 120. This may be part of the "Propagate data phase" of the DIAL block or processor cycle. Receiving the event trigger signal at 120 may occur before, during or after the outputs of the DIAL block, except those based on inputs from the event trigger signal at 120, assume valid states (e.g., see FIGS. 3A-B).

As shown by the "No" loop from 120 of process 100, if the event trigger signal has not yet been received by the DIAL block or processor at 120, the propagate data phase continues to wait for the event trigger signal even to occur or be signaled to the DIAL block or processor. As shown by the "Yes" path from 120, if the event trigger signal has been received by the DIAL block or processor, the propagate data phase may be completed at 130.

In some cases, receiving the event trigger signal at 120 may be part of the determining if all of the outputs of the DIAL block assumed valid states. For example, the outputs of the DIAL block assuming valid states may depend on or include receiving the event trigger signal at 120. Here, the outputs for completing propagate data at 130 may include DIAL values that use as inputs, DIAL values that are or derive from the event trigger signal at 120.

As shown at 130 of process 100, if the outputs of the DIAL block have not yet all assume valid states, the propagate data phase continues to propagate the input values through the DIAL block until the outputs do assume valid states. If the event trigger signal has been received at 120 and the outputs of the DIAL block have all assume valid states, the propagate data phase may be completed at 130.

When the propagate data cycle is complete at 130, the acknowledge signal is de-asserted at 140. De-assertion at 140 may include providing the de-asserted acknowledgment signal and/or a completion signal at an output to an input of the DIAL block or processor, to request initiation of the next null/data cycle at 150. In other cases, it may request and end of the process at end 195.

Consequently, each propagate data phase of the process is stalled at 120 to await receipt of an event trigger signal indicating an external event has occurred. Once the event trigger signal is received, the propagate data phase completes at 130, initiating the next cycle at 150.

It is considered that there may be one or more multi-rail DIAL data process values in the DIAL block related to the DIAL null states at 150 and valid states at 130. In this case, all of the outputs of the block that must reach the null state at 150, and the valid state at 130 include all of the DIAL data process values. These data process values may include the DIAL block input and output values. They may include intermediate values between the input and output values, such as values of threshold gates or other DIAL. They may also include values input from, processed from and/or output as a result of receiving the event trigger signal at 120.

Description of Apparatus

Figure 2:
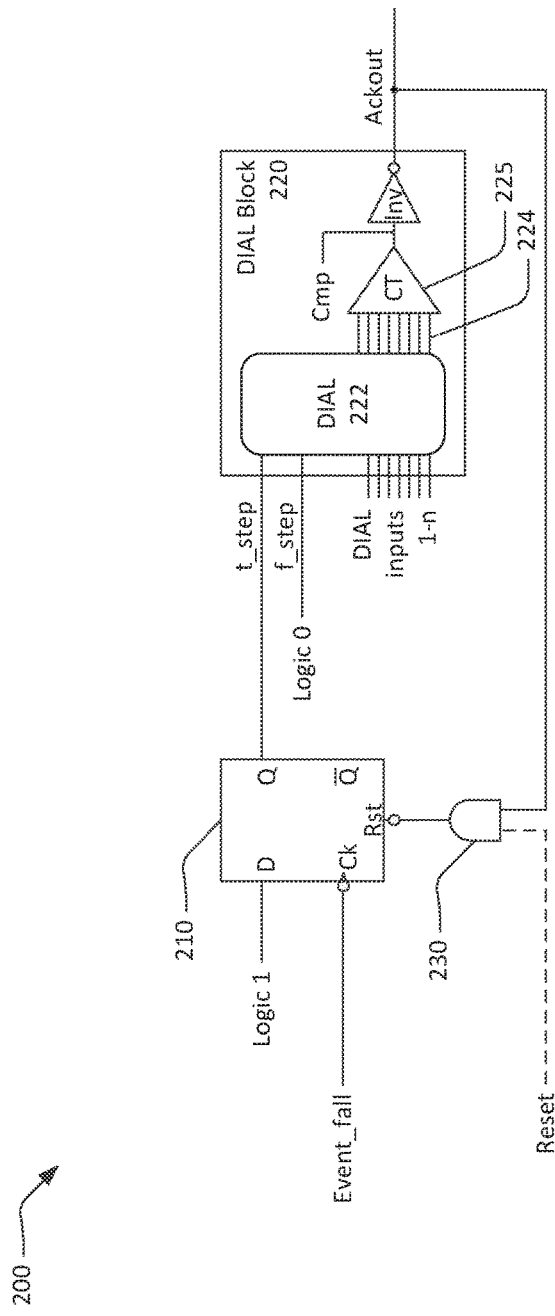
FIG. 2 is a block diagram of an event trigger circuit for delay insensitive asynchronous logic (DIAL).

FIG. 2 is a block diagram of an exemplary event trigger circuit 200 to implement the process 100. The circuit 200 may be or be a small portion of an asynchronous processor. The asynchronous processor may have multiple instances of the circuit 200. The event trigger circuit 200 includes a flip-flop (FF) 210 to capture an event trigger signal "Event_fall" and a dual-rail DIAL block 220. The circuit 200 has the FF 210 coupled to and between a reset logic 230 and the DIAL block 220.

The FF 210 may be a Boolean logic flip flop having a clock logic input "Ck", and a data input "D" having two possible Boolean logic values (e.g., data one or 1; and data zero or 0). It has a data output "Q" having two possible Boolean logic values; and an inverted output Q (not). The FF 210 may be described as trigger logic or a trigger flip flop. The clock logic input "Ck" may be described as a clock input to receive "Event_fall" which may be an event trigger signal. When "Event_fall" becomes a certain data value it may cause the clock input of FF 210 to cycle and output data input "D" at output "Q". The data input "D" may be described as being set to a data value, which is data 1 in this example. The FF 210 may be implemented as described for or in a register transfer logic (RTL) design.

The FF 210 may be an electronic circuit having just one data input "D" in addition to the clock input "Ck". When the clock input "Ck" is triggered, the output "Q" is matched to the data input "D". After FF 210 is reset, the output "Q" may be data 0 until triggering the input "Ck". The clock input "Ck" may be triggered by a change in the signal received at "Ck" that has an amplitude that exceeds or falls below a predetermined signal threshold. It may also be triggered another signal feature such as amplitude over time that exceeds (or falls below) a threshold amount. In some cases, it may be triggered by a frequency change of the signal that exceeds (or falls below) a threshold level at any time or exceeds an amount of change over time.

Thus, when the clock input "Ck" is triggered, if the data input "D" is "high" (e.g., data one), the output "Q" goes high; and if the data input "D" is "low" (e.g., data zero), the output "Q" output goes low. Output "Q" may be described as a trigger output; and "t_step" may be a trigger output signal or a trigger data output. In some cases, other logic or logic types that perform the same function, such as outputting a trigger output signal upon receiving an event trigger signal and resetting the output upon receiving a reset signal, can be used to provide logic 210.

The DIAL block 220 may be an electronic circuit having DIAL 222 coupled to the FF 210 and having data phase completion logic circuit "CT" 225. The block 220 also includes inverter Inv such as to invert a completion signal "Cmp" from "CT" 225, to turn "Cmp" into an acknowledgment signal "Ackout" which is output by block 220 to the reset logic 230.

The DIAL block 220 may be implemented as including some or as having only threshold gates. In another case, the DIAL block 220 may also be implemented as having zero or excluding threshold gates. The DIAL block 220 may have DIAL which is identified by a conversion or transformation from an RTL design. The DIAL block 220 and DIAL 222 are shown receiving multi-rail DIAL inputs for multi-rail DIAL data input "step" and multi-rail DIAL data inputs "DIAL inputs 1-n".

The DIAL 222 outputs multi-rail DIAL output values 224 to "CT" 225 so that "CT" 225 can determine if the outputs have reached a DIAL null state or a DIAL valid state. If they reach a null state, "CT" 225 outputs "Cmp" low and inverter Inv outputs "Ackout" high. If they reach a valid state, "CT" 225 outputs "Cmp" high and inverter Inv outputs "Ackout" low. In this example, "Cmp" may be a completion signal indicating an end of a data propagate phase of the DIAL block 220 and may reset the trigger output signal "Q" when the multi-rail data DIAL data process values of the DIAL block 220 reach a DIAL valid state.

The DIAL block 220 may have additional inputs and outputs not shown in FIG. 2. For example, the DIAL block may use multi-rail DIAL data process values, which may include the inputs and outputs, during use of the processor to perform data processing and/or mathematical calculations. The calculations may be output in other output signals that are not shown. It can be appreciated that various other DIAL that perform the same function can be used to provide logic 220.

The reset logic 230 may be a Boolean logic AND gate having a first input of "Ackout" and a second data input Reset, each having two possible Boolean logic values. It has a data output having two possible Boolean logic values, which is inverted to form reset signal Rst that is used to reset the FF 210. The reset logic 230 may be implemented as described for or in an RTL design.

The reset logic 230 may be an electronic circuit having that outputs signal "Rst" as low when both inputs, Reset and "Ackout" are high, thus not resetting the FF 210 during the propagate data phase if Reset is high. When either Reset or "Ackout" is low, "Rst" is high, thus resetting the FF 210 during the propagate null phase or if Reset is low. Reset may be a global reset signal (when low at Reset) for the processor, block 220 or a device including the processor. It can be appreciated that various other logic or logic types that perform the same function can be used to provide the reset logic 230.

The flip-flop 210 converts "Event_fall" received at the clock input "Ck" into a dual-rail DIAL variable "step", which is input to the DIAL block 220 (e.g., as rails t_step and f_step). "Event_fall" may be an event trigger signal such as a synchronous clock falling edge. Here, it is possible to trigger the DIAL block 220 once for each falling edge of "Event_fall". In other cases, it can be another signal such as a rising edge of a clock signal. It can be a feature of a non-clock signal such as an amount of amplitude and/or frequency change of that signal that exceeds a threshold level or amount of change. In this example, "step" may be first multi-rail DIAL input data signal, while "DIAL inputs 1-n" are at least one second multi-rail DIAL input data signal.

In some cases, the clock input "Ck" of the FF 210 may be connected to a synchronous clock (e.g., signal of source) that is located external to the processor or to the circuit 200. The data input "D" is set to a high Boolean data value at "Logic 1". The output "Q" may be a Boolean trigger output value to be converted to a true rail value of dual-rail DIAL input "step". The output "Q" may switch values, switching the value of "step" when the event trigger signal is received at the clock input "Ck".

As shown, "step" has two rails "t_step" and "f_step" that are received as a multi-rail DIAL input of the block 220 of the DIAL 222. In this example, "f_step" is permanently set at logic zero (see "Logic 0"). Also, "t_step" is connected to the "Q" output of the flip-flop 210. Consequently, the DIAL dual rail signal "step" is only allowed to be in one of two states, either the null state, or data one state. Data zero (and 1,1—illegal) is not an option because input "f_step" is not set to logic one.

Although the circuit 200 is shown as one example for implementing process 100, it is considered that various other circuits or logic inputs to the circuit 200 may be used to implement that process. For example, logic polarities can be adjusted and reversed at points by one skilled in the art.

Figure 3A:
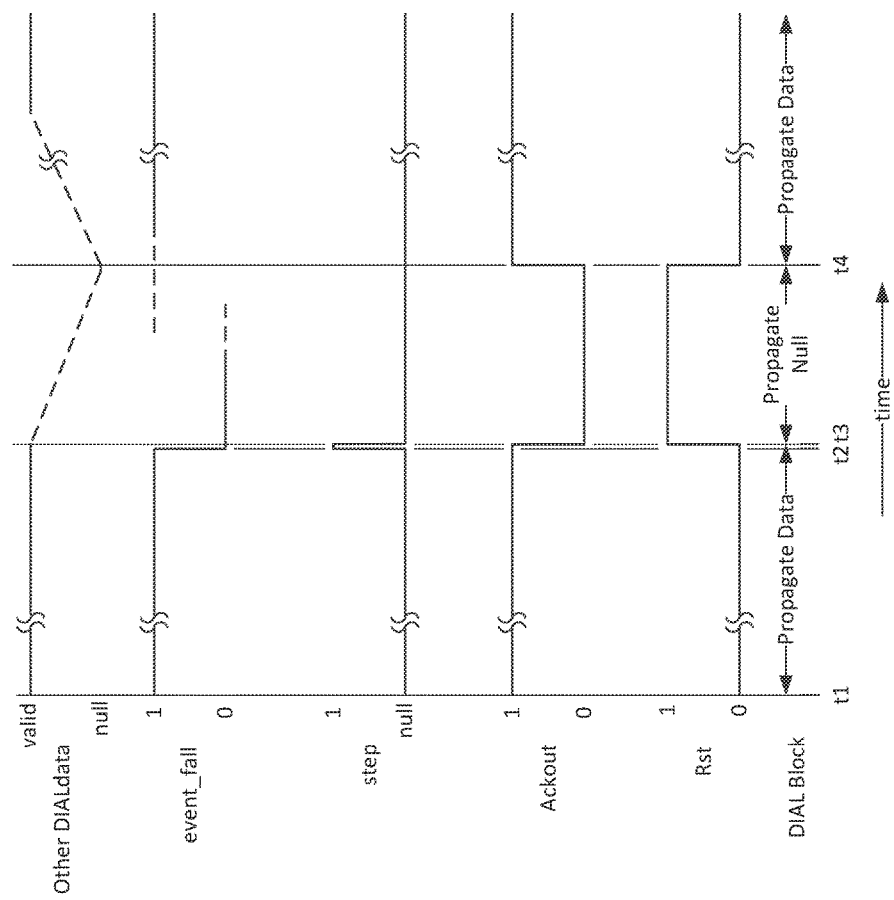
FIGS. 3A-B are timing diagrams illustrating operation of the event trigger circuit.
Figure 3B:
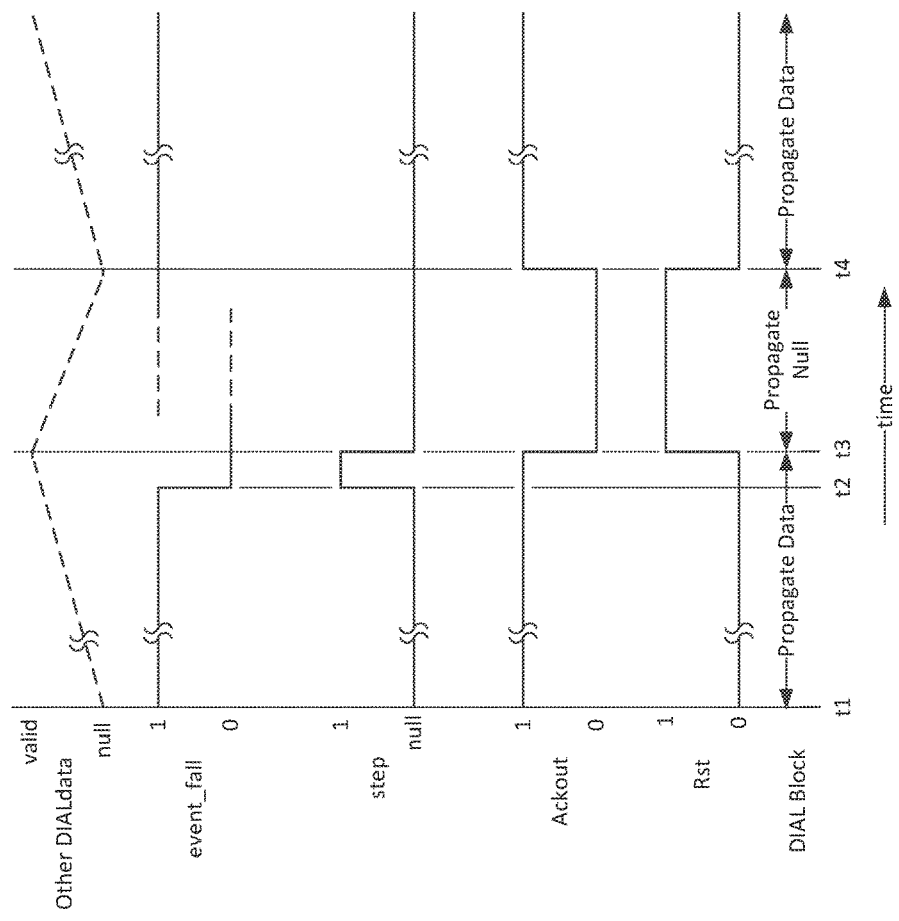

FIG. 3A-B are timing diagrams for the event trigger circuit 200. They may also apply to the process 100 of FIG. 1. In FIG. 3A-B, at time t1, the DIAL block 220 is paused during the propagate data phase and waiting for a valid output from logic 210 indicating the receipt of an event trigger signal. At time t2, the falling edge of "Event_fall" causes "step" to change from null to one, and the DIAL block 220 receives the valid output of logical 1 (e.g., high=1,0) as "step". At time t3, the propagate data phase is complete and "Ackout" is de-asserted, causing "step" or the output of the FF 210 to be reset to null. At time t4, the propagate null phase is completed, "Ackout" is asserted, and the cycle is repeated, starting again at time t1.

FIG. 3A shows a case where all of the "Other DIAL data" outputs of the DIAL block 220 or DIAL 222, except those based on the "Event_fall" input have assumed valid states prior to receiving "Event_fall" at the clock input "Ck" of the FF 210. Here, the receipt of the falling clock edge at "Event_fall" causes "step" (e.g., t_step) to go high to data=1,0; which de-asserts "Ackout" and resets the FF 210. This is akin to having DIAL data valid except those based on the "Event_fall" input, prior to receiving event trigger signal at 120 of FIG. 1.

FIG. 3B shows a case where all of the "Other DIAL data" outputs of the DIAL block 220 or DIAL 222 except those based on the "Event_fall" input have not assumed valid states prior to receiving "Event_fall" at the clock input "Ck" of the FF 210. Here, the receipt of the falling clock edge at "Event_fall" has already caused "step" (e.g., t_step) to go high to data=1,0. Then, the outputs of the DIAL block 220 or DIAL 222 all assuming valid states de-asserts "Ackout" and resets the FF 210. This is akin to receiving event trigger signal at 120 prior to having DIAL data valid except those based on the "Event_fall" input in FIG. 1.

Again, returning to FIG. 2, when the DIAL block 220 is switched to and in the propagate null phase, the flip-flop 210 is reset by the de-asserted (e.g., low or logic 0) acknowledge signal "Ackout" from the DIAL block 220. This sets "step" to null ("f_step"="t_step"=logic zero) when "Ackout" is de-asserted (and "Cmp" is asserted). An example of this is shown at 140-160 of FIG. 1; and by "Rst" asserted between times t3 and t4 of FIGS. 3A-B.

Then, when the DIAL block 220 enters and is in the propagate data phase, "Ackout" is asserted. An example of this is shown at 110 of FIG. 1; and by "Rst" de-asserted between time t1 of FIGS. 3A-B. For example, at or after time t4, time t1 may occur in FIGS. 3A-B.

When in the propagate data phase, the flip-flop 210 holds "step" at null state until its clock input is clocked by the failing edge of "Event_fall". Alternatively, a rising edge triggered flip-flop could be clocked by the rising edge of an event trigger signal. It is also considered that another event sensing circuit can be used to sense an event trigger signal and drive true onto the "t_step" rail of the dual rail signal "step".

The DIAL block 220 cannot complete its propagate data phase while "step" is in the null state. Here, the completion logic "CT" 225 also holds "Ackout" as asserted. Thus, the circuit 200 pauses, with the propagate data phase partially completed, until an event trigger signal is received. An example of this is shown at the "No" loop from 120 of FIG. 1; and by "step" being null for periods of time shown between times t1 and t2 of FIGS. 3A-B.

The DIAL block 220 can also not complete its propagate data phase while the outputs of the DIAL block 220 or DIAL 222 have not yet all assume valid states. Here, the completion logic "CT" 225 also holds "Ackout" as asserted. Thus, the circuit 200 pauses, with the propagate data phase partially completed, until outputs of the DIAL block 220 or DIAL 222 have all assume valid states. An example of this is shown at 130 of FIG. 1; and by "Other DIALdata" not being valid for periods of time shown between times t1 and t3 of FIGS. 3A-B.

Once clocked by receiving an event trigger signal (e.g., that exceeds a predetermined threshold), the flip-flop 210 sends a trigger output signal. For instance, it sets "t_step" to the data input "D" which sets "step" to "one" ("t_step", "f_step"=1,0). Once the outputs of the DIAL block 220 or DIAL 222 have all assume valid states, then, the DIAL block 220 is enabled to complete the propagate data phase. This may include all of the data process values of the DIAL block 220 reaching valid states. An example of this is shown at 130 of FIG. 1; and by the later of either "step" being asserted (e.g., data 1,0) at a point in time as shown between times t1 and t3; or of "Other DIALdata" being valid at a point in time as shown between times t1 and t3 of FIGS. 3A-B.

When the propagate data phase is complete, "Ackout" is de-asserted and the cycle repeats. This may include asserting reset signal "Rst" to reset the FF 210, such as to reset the output "Q" to logic zero and "step" to the null state. An example of this is shown at 140 of FIG. 1; and by the resetting of inputs to null for "Other DIALdata", resetting of "step", de-assertion of "Ackout" and assertion of "Rst" at time t3 of FIGS. 3A-B. As noted, after time t3, the process continues to time t4 where the propagate null phase is completed.

The event trigger circuit 200 of FIG. 2 and timing diagrams of FIGS. 3A-B are exemplary. Variations of the event trigger circuit 200 may be used with other forms of self-timed or asynchronous logic, so long as the self-timed logic provides an acknowledge or equivalent signal to reset a flop-flop or other circuit that samples the event trigger signal.

The processes and devices of FIGS. 1-3B provide benefits as compared to a DIAL block cycling between the propagate null and propagate data phases. First, the processes and devices of FIGS. 1-3B do not consume unnecessary power by cycling through the propagate null and propagate data phases numerous times while waiting to be synchronized with relatively infrequent event. In addition, those processes and devices of FIGS. 1-3B are able to run exactly one propagate null/data phase cycle in response to an external event. They also provide the advantage of being able to implement the register transfer logic (RTL) for the DIAL block 220 first in clocked logic using the single rail step signal directly to step the logic, and then convert the RTL for block 220 to DIAL, while leaving the RTL versions of the FF 210 and optionally of the reset logic 230.

The structure of the asynchronous processor that is or includes the circuit 200 is exemplary and an asynchronous processor may contain more than the DIAL block 220, which may be interconnected in a variety of ways, such as at "DIAL inputs 1-n". In general, each functional block in an asynchronous processor provides data to and/or receives data from at least one other functional block. Further, each functional block provides an acknowledge signal to and/or receives an acknowledge signal from at least one other functional block. Typically, each function block provides its acknowledge signal to other function blocks from which it receives data, and each function block receives an acknowledge signal from other function blocks to which it provides data Closing Comments Throughout this description, the embodiments and examples shown should be considered as exemplars, rather than limitations on the apparatus and procedures disclosed or claimed. Although many of the examples presented herein involve specific combinations of method acts or processor elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A self-timed processor comprising:
    trigger logic having:
        a trigger input to receive an event trigger signal, a data input set to a data value of 1, a trigger output to send a trigger output signal when the event trigger signal is received, and a reset input to reset the trigger output signal;
    a delay insensitive asynchronous logic (DIAL) block having:
        multi-rail DIAL inputs to receive at least a first multi-rail DIAL input data signal having a) a first rail input that is the trigger output signal, and b) a second rail input that is set to a data value of 0;
        multi-rail DIAL to process at least the first multi-rail DIAL input data signal using multi-rail DIAL data process values; and
        data phase completion logic to output a completion signal indicating an end of a data propagate phase of the DIAL block to reset the trigger output signal when the multi-rail data DIAL data process values reach a DIAL valid state.

2. The self-timed processor of claim 1, wherein the trigger logic includes a Boolean logic flip flop (FF) having the trigger input, the data input, the trigger output, and the reset input; wherein the trigger input is a clock input to be triggered by a clock edge signal, wherein the trigger output signal has two possible Boolean logic values that are based on whether the clock input has been triggered, wherein the trigger output signal is the same data value as the data value of 1 when the clock input is triggered, and wherein the second rail input is the opposite data value of the trigger output signal.

3. The self-timed processor of claim 1, further comprising reset logic to receive the completion signal and output a reset signal to the reset input of the trigger logic to reset the trigger output when the completion signal is received.

4. The self-timed processor of claim 1, wherein the trigger logic switches the trigger output signal to the data value while the event trigger signal is asserted and the reset output is not asserted; and switches the trigger output signal to opposite the data value while the completion signal is asserted.

5. The self-timed processor of claim 1, wherein the trigger input is connected to a synchronous clock that is located external to the processor.

6. The self-timed processor of claim 1, wherein:
    the multi-rail DIAL inputs are to receive at least a second multi-rail DIAL input data signal;
    the multi-rail DIAL is to process at least the first and second multi-rail DIAL input data signal using the multi-rail DIAL data process values; and the data phase completion logic is to output the completion signal when the multi-rail data DIAL data process values reach a DIAL valid state for processing the first and second multi-rail DIAL input data signal.

7. The self-timed processor of claim 1, wherein the data phase completion logic is to output an acknowledgement signal indicating an end of a data null phase of the DIAL block to the reset logic when the multi-rail data DIAL data process values reach a DIAL null state.

8. The self-timed processor of claim 7, wherein the reset logic is to send the reset signal to the trigger logic while the completion signal is received and is not to send the reset signal while the acknowledgment signal is received.

9. An asynchronous processor comprising:
a trigger flip flop to send a trigger data output value of 1 upon receipt of an event trigger signal at a clock input; and
a delay insensitive asynchronous logic (DIAL) block A) to receive at least a first multi-rail DIAL input data signal having a) a first rail input that is the trigger data output, and b) a second rail input that is set to a second rail data value of 0 that is opposite the trigger data output value of 1; B) to output a completion signal to reset the flip flop when multi-rail data DIAL data process values of the DIAL block reach a DIAL valid state.

10. The asynchronous processor of claim 9, wherein the trigger flip flop includes Boolean logic having a clock input to be triggered by a clock edge signal, a trigger output having two possible Boolean logic values based on whether the clock input has been triggered, and a reset input to reset the trigger output when the completion signal is received.

11. The asynchronous processor of claim 9, wherein the trigger data output is to switch to a value that is opposite the second rail input when the event trigger signal is asserted and the reset output is not asserted; and switch to the second rail input when the completion signal is asserted.

12. The asynchronous processor of claim 9, wherein the trigger flip flop is to receive the event trigger signal from a source located external to the DIAL block.

13. The asynchronous processor of claim 9, wherein:
the DIAL block is C) to receive at least a second multi-rail DIAL input data signal; and D) output the completion signal to reset the flip flop when multi-rail data DIAL data process values of the DIAL block reach a DIAL valid state when processing the first and second multi-rail DIAL input data signals.

14. The asynchronous processor of claim 9, wherein the DIAL block is to output an acknowledgement signal indicating an end of a data null phase of the DIAL block to reset logic when the multi-rail data DIAL data process values reach a DIAL null state.

15. The asynchronous processor of claim 14, wherein reset signal is to be sent to the trigger flip flop while the completion signal is received and is not to be sent while the acknowledgment signal is received.

16. A method of processing data within a self-timed processor, comprising:
receiving an event trigger signal at a clock input of a flip flop;
outputting a trigger data output value of 1 upon receipt of the event trigger signal at a clock input;
receiving at a delay insensitive asynchronous logic (DIAL) block at least a first multi-rail DIAL input data signal having a) a first rail input that is the trigger data output, and b) a second rail input that is set to a second rail data value of 0 that is opposite the trigger data output value of 1; and
outputting from the DIAL block, a completion signal to reset the flip flop when multi-rail data DIAL data process values of the DIAL block reach a DIAL valid state.

17. The method of claim 16, wherein outputting the trigger data output includes triggering the flip flop with a clock edge signal, and outputting a Boolean logic value; and further comprising:
resetting the trigger data output to the second rail data value when the completion signal is received.

18. The method of claim 16, wherein outputting the trigger data output includes:
switching the trigger data output to opposite the second rail data value when the received event trigger signal is asserted; and
switch the trigger data output to the second rail data value when the completion signal is asserted.

19. The method of claim 16, wherein receiving the event trigger signal includes receiving the event trigger signal from a source located external to the DIAL block.

20. The method of claim 16, wherein:
receiving at least a first multi-rail DIAL input data signal includes receiving at least a second multi-rail DIAL input data signal; and
outputting the completion signal includes outputting the completion signal when multi-rail data DIAL data process values of the DIAL block reach a DIAL valid state when processing the first and the second multi-rail DIAL input data signal.

21. The method of claim 16, further comprising the DIAL block outputting an acknowledgement signal indicating an end of a data null phase of the DIAL block when the multi-rail data DIAL data process values reach a DIAL null state.

* * * * *